United States Patent [19]
Kumar et al.

[11] Patent Number: 5,751,537
[45] Date of Patent: May 12, 1998

[54] MULTIELECTRODE ELECTROSTATIC CHUCK WITH FUSES

[75] Inventors: Ananda H. Kumar, Milpitas; Shamouil Shamouilian, San Jose, both of Calif.

[73] Assignee: Applied Materials, Inc., Santa Clara, Calif.

[21] Appl. No.: 641,938

[22] Filed: May 2, 1996

[51] Int. Cl.$^6$ .................................................. H02N 13/00
[52] U.S. Cl. ......................................................... 361/234
[58] Field of Search ................................. 340/638, 639; 324/550, 551, 555, 556; 361/233, 234, 235, 104

[56] References Cited

U.S. PATENT DOCUMENTS

| | | | |
|---|---|---|---|
| 4,184,188 | 1/1980 | Briglia | 361/234 |
| 4,281,322 | 7/1981 | Nasu et al. | 340/638 |
| 4,384,918 | 5/1983 | Abe | 156/643 |
| 4,480,284 | 10/1984 | Tojo | 361/234 |
| 4,502,094 | 2/1985 | Lewin et al. | 361/234 |
| 4,508,161 | 4/1985 | Holden | 165/1 |
| 4,514,723 | 4/1985 | Leal | 340/638 |
| 4,520,421 | 5/1985 | Sakitani et al. | 361/234 |
| 4,645,218 | 2/1987 | Ooshio et al. | 279/1 M |
| 4,724,510 | 2/1988 | Wicker et al. | 361/234 |
| 4,751,609 | 6/1988 | Kasahara | 361/234 |
| 4,945,345 | 7/1990 | Proctor et al. | 340/638 |
| 5,117,121 | 5/1992 | Watanabe et al. | 307/130 |
| 5,151,845 | 9/1992 | Watanabe et al. | 361/234 |
| 5,184,398 | 2/1993 | Moleshi | 29/825 |
| 5,221,403 | 6/1993 | Nozawa et al. | 156/345 |
| 5,283,553 | 2/1994 | Ishii et al. | 340/664 |
| 5,463,526 | 10/1995 | Mundt | 361/234 |
| 5,539,609 | 7/1996 | Collins et al. | 361/234 |
| 5,542,559 | 8/1996 | Kawakami et al. | 216/67 |

FOREIGN PATENT DOCUMENTS

| | | |
|---|---|---|
| 63-308340 | 12/1988 | Japan . |
| 1-283734 | 10/1989 | Japan . |
| 2-246136 | 10/1990 | Japan . |
| 3-145151 | 6/1991 | Japan . |
| 5-13557 | 1/1993 | Japan . |
| 5-291562 | 11/1993 | Japan . |
| 6244146 | 9/1994 | Japan . |

*Primary Examiner*—Fritz Fleming
*Attorney, Agent, or Firm*—Ashok K. Janah; James C. Wilson

[57] ABSTRACT

A failure resistant electrostatic chuck 20 for holding a substrate 35 during processing of the substrate 35, is described. The chuck 20 comprises a plurality of electrodes 25 covered by an insulator 30, the electrodes 25 capable of electrostatically holding a substrate 35 when a voltage is applied thereto. An electrical power bus 40 has a plurality of output terminals 45 that conduct voltage to the electrodes 25. Fuses 50 electrically connect the electrodes 25 to the output terminals 45 of the power bus 40, each fuse 50 connecting at least one electrode 25 in series to an output terminal from the power bus 40. The fuses 50 are capable of electrically disconnecting the electrode 25 from the output terminals 45 when the insulator 30 punctures and exposes the electrode 25 to the process environment causing a current to flow through the fuse 50. A current detector 175 and electrical counter 180 can be used to provide early detection and counting of the number of failures of the electrodes 25 by detecting the current discharges through the fuses 50.

65 Claims, 8 Drawing Sheets

MULTIELECTRODE ELECTROSTATIC CHUCK WITH FUSES

BACKGROUND

The present invention is directed to multielectrode structures, and in particular, electrostatic chucks that are useful for holding substrates.

Electrostatic chucks are used to hold substrates, such as a silicon wafers, during processing of the substrate in a process chamber. A typical electrostatic chuck includes an insulated electrode that is electrically biased with respect to the substrate by an electrical voltage. During processing of the substrate, process gas is introduced into the process chamber, and in certain processes, an electrically charged plasma is formed from the process gas. The electrical voltage and plasma induce opposing electrostatic charge in the electrode and substrate that results in an attractive electrostatic force that electrostatically holds the substrate to the chuck.

Typically, the electrostatic chuck comprises a metal electrode covered by a thin polymeric insulator layer. The thin polymer layer maximizes electrostatic attractive forces between the substrate and the electrode. However, when the substrate held on the chuck breaks or chips to form fragments having sharp edges, the substrate fragments puncture the polymer film exposing the electrode of the chuck, particularly when the polymer is soft and has low puncture resistance at high processing temperatures. Exposure of the electrode at even a single pinhole in the insulator can cause arcing between the electrode and plasma, and require replacement of the entire chuck. Polymer insulators also have a limited lifetime in erosive process environments, such as processes using oxygencontaining gases and plasmas. In these processes, the exposed insulator on the electrode can be eroded by the erosive process gas to expose the electrode to the process environment resulting in failure of the chuck. Failure of the electrostatic chuck during processing of a substrate can result in loss of the entire substrate at a significant cost.

Traditional solutions to increase the puncture or erosion resistance of the insulator on the electrode, include the use of hard ceramic or composite insulator layers to provide increase resistance to puncturing by substrate fragments. For example, U.S. Pat. No. 4,480,284 discloses a ceramic layer made by flame spraying $Al_2O_3$, $TiO_2$, $BaTiO_3$, or a mixture of these materials over an electrode, and impregnating the pores of the ceramic dielectric with a polymer. Layered ceramic and polymer structures can also be used to increase the puncture resistance of the chuck. However, there are several problems with these structures. One problem with the use of ceramic coatings is that the volume resistivity of ceramic layers generally decreases to values less than $10^{11}$ Ωcm with increasing temperature which results in unacceptable current leakage from the electrodes of the chuck at high temperatures. Another problem is that the different layers of composite materials often delaminate from one another, particularly when the thermal expansion coefficients of the layers are mismatched. A further problem is that complex processing methods are needed to form ceramic or composite insulator structures.

Another problem with conventional electrostatic chucks, and related systems, arises from the inability to continue operation of the chuck, or detect and predict failure of the chuck, before the chuck catastrophically fails in a processing environment resulting in loss of the entire substrate.

Conventional methods typically terminate the substrate process cycle before the chuck fails, or anticipate failure by detecting holes in the insulator of the chuck. For example, Japanese patent document JP 06244146-A discloses use of a current detector in the voltage path of the chuck electrode, and a controller for stopping processing of the substrate when the detector detects a current exceeding a given level. However, it is difficult to complete processing of the partially processed substrate that results when the substrate process is terminated before completion. Another solution, described in Japanese patent document JP 2246136, uses a defect checker which utilizes a high voltage to detect pinholes in the insulator layer on the electrode of the chuck. However, this method cannot be used to detect or anticipate failure of the chuck during processing of the substrate. Thus, conventional chucking systems do not provide a chuck that is resistant to failure during processing, or allow detection and anticipation of failure of a chuck before actual failure of the chuck in a processing environment.

Thus, it is desirable to have electrostatic chuck that is resistant to failure from puncturing by substrate fragments, and from failure by erosion in erosive process environments. It is also desirable for the chuck to be tolerant to punctures to allow the chuck to continue holding a substrate even with multiple punctures in the insulator layer. It is also desirable to detect or anticipate failure of the chuck at an early stage so that the chuck can be replaced before it catastrophically fails during processing of the substrate. It is further desirable to have a chuck that can be inexpensively fabricated using conventional fabrication equipment.

SUMMARY

The present invention is directed to a failure resistant electrostatic chuck useful for holding a substrate in a process environment. One version of the chuck comprises a plurality of electrodes covered by insulator. The electrodes are capable of electrostatically holding a substrate when a voltage is applied to the electrodes. An electrical power bus has a plurality of output terminals that conduct voltage to the electrodes. A plurality of fuses are provided, each fuse electrically connecting at least one electrode in series to an output terminal from the power bus. The fuses are capable of electrically disconnecting the electrodes from the output terminals when the insulator punctures and exposes the electrodes to the process environment causing a current to flow through the fuses. Preferably, the electrodes of the chuck are planar, and the electrical power bus has output terminals that are substantially coplanar with the electrodes.

In another configuration, useful for holding substrates in non-plasma processes, the electrostatic chuck comprises first and second groups of electrodes covered by insulator, the electrodes sized and configured to serve as bipolar electrodes and capable of electrostatically holding a substrate when a voltage is applied thereto. A first electrical power bus has a first set of output terminals for providing voltage to the first group of electrodes, and a second electrical power bus has a second set of output terminals for providing voltage to the second group of electrodes. A plurality of fuses is provided, each fuse electrically connecting at least one electrode in series to an output terminal from a power bus. The fuses are capable of electrically disconnecting the electrodes from the output terminals when the insulator punctures and exposes the electrodes to the process environment, causing a current to flow through the fuse.

In another aspect of the invention, the electrodes of the chuck comprise (i) peripheral electrodes in a periphery of the insulator, and (ii) central electrodes in a central portion of the insulator. A first power bus has a first set of output terminals that provides voltage to the peripheral electrodes, and a second power bus has a second set of output terminals that provide voltage to the central electrodes. Fuses electrically connect the electrodes in series to output terminals from the power buses and are capable of electrically disconnecting the electrodes from the output terminals when the insulator punctures and exposes the electrodes to the process environment causing a current to flow through the fuse. This version allows early replacement of the chuck when any one of the peripheral electrodes is exposed to the plasma environment, the peripheral electrodes being particularly important to prevent leakage of heat transfer fluid held below the chuck.

The present invention also provides an electrostatic chuck system that allows early detection, and optionally counting, of failure of electrodes of the electrostatic chuck. This system uses a current detector to detect current flow through the fuses, the current flow occurring when insulator on an electrode punctures and allows the electrostatic charge in the substrate to discharge as a current through the electrode and contiguous fuse. The current detector deflects the current discharge before the fuse electrically disconnects the electrode from the output terminal of the fuse. Preferably, the system further comprises a counter for counting the number of times current discharges through the fuses, providing an estimate of the number of failed electrodes, to allow replacement of the chuck before catastrophic failure of the chuck.

The present invention further teaches methods for forming the failure resistant electrostatic chucks. One method comprises the steps of (a) selecting a first insulator layer, (b) forming electrodes, electrical power buses, and fuses on the first insulator layer, and (c) forming a second insulator layer over the electrodes, electrical power buses, and fuses. In another method, the electrostatic chuck can be fabricated using a composite layer including (i) a first insulator layer, (ii) a resistor layer, and (iii) an electrical conductor layer. The composite layer is etched to form the electrodes and electrical power buses from the electrical conductor layer, and the resistors from the resistor layer. Each of the resistors serves as a fuse and electrically connecting at least one electrode to an electrical power bus. A second insulator layer is formed over the etched composite layer to fabricate the chuck.

DRAWINGS

The features, aspects, and advantages of the present invention will become better understood with regard to the following description, appended claims, and accompanying drawings which illustrate versions of the invention, where:

FIG. 2b is a partial sectional schematic side view of a bipolar electrostatic chuck of the present invention;

FIG. 4 is a cross-sectional schematic side view of another embodiment of an electrostatic chuck of FIG. 1a;

FIG. 5 is a cross-sectional schematic side view of another embodiment of an electrostatic chuck of FIG. 1a;

FIG. 6 is a cross-sectional schematic side view of another embodiment of an electrostatic chuck of FIG. 1a;

FIG. 7 is a cross-sectional schematic side view of another embodiment of an electrostatic chuck of FIG. 1a.

DESCRIPTION

The present invention is useful for multielectrode structures, such as capacitors, batteries, and electrostatic chucks. Although the present invention is illustrated in considerable detail in the context of an electrostatic chuck useful for holding substrates in process environments, many other versions of the invention should be apparent to those skilled in the art, without deviating from the scope of the invention. Therefore, the spirit and scope of the present invention should not be limited to the description of the preferred versions contained herein.

Figure 1A:
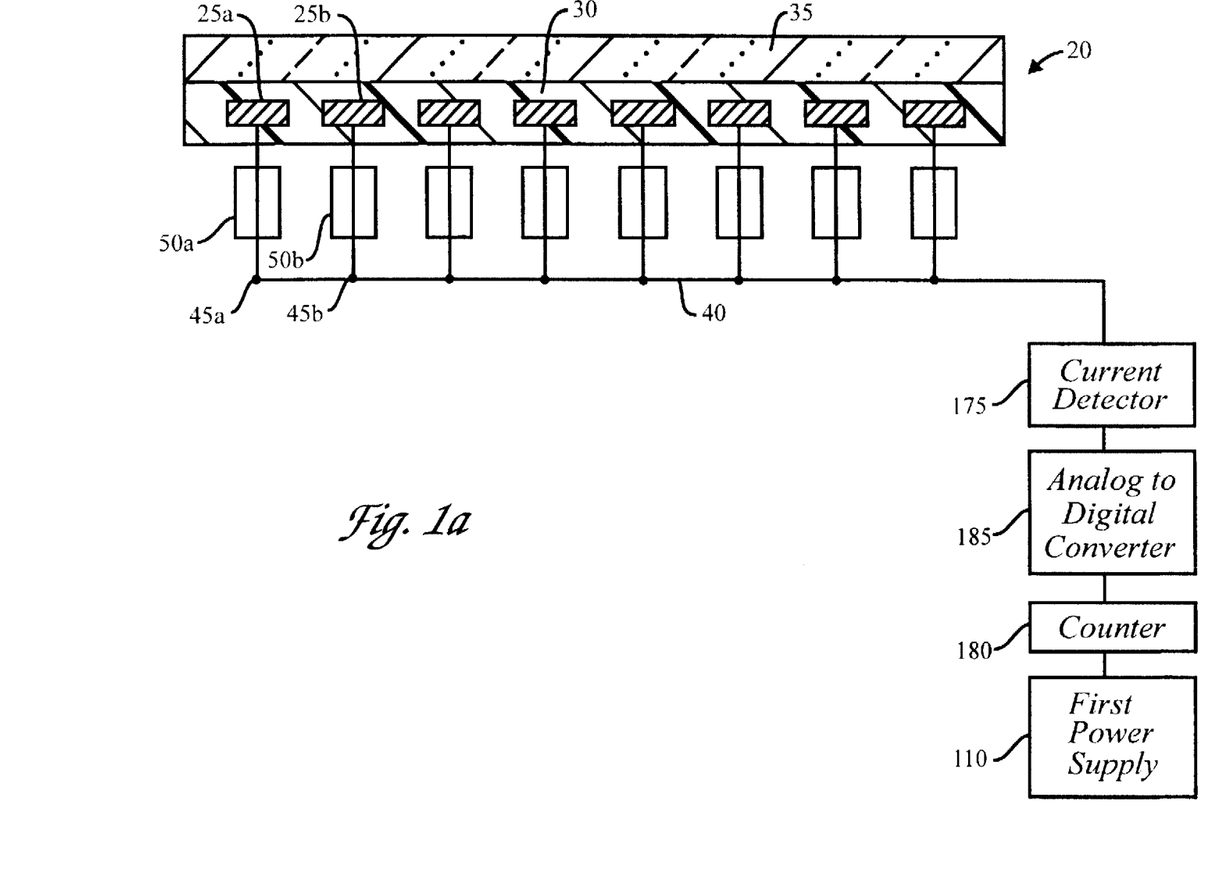
FIG. 1a is a partial sectional schematic side view of a monopolar electrostatic chuck of the present invention.
Figure 1B:
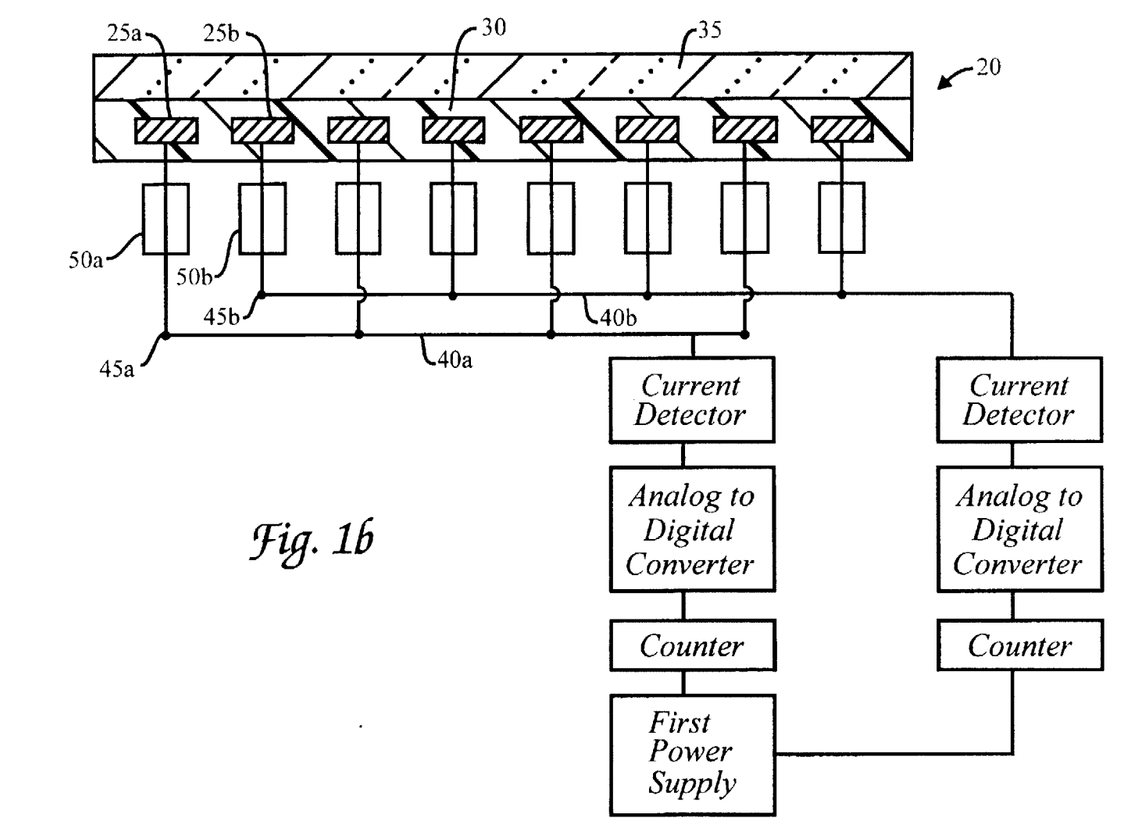

As schematically illustrated in FIGS. 1a and 1b, an electrostatic chuck of the present invention comprises a plurality of monopolar or bipolar electrodes 25a, 25b covered by a layer of insulator 30. The electrodes 25a,25b capable of electrostatically holding a substrate 35 when a voltage is applied to the electrodes 25a, 25b, as described below. An electrical power bus 40 comprises a plurality of output terminals 45a, 45b for conducting voltage to the electrodes 25a, 25b. Fuses 50a, 50b electrically connect the electrodes 25a, 25b to the output terminals 45a, 45b of the power bus 40.

Each fuse 50a connects at least one electrode 25a in series to an output terminal 45a and is capable of electrically disconnecting the electrode 25a from the output terminal 45a when the insulator 30 over the electrode, punctures and exposes the electrode to the process environment causing a current to flow from the electrode 25a and through the fuse 50a.

Figure 2:
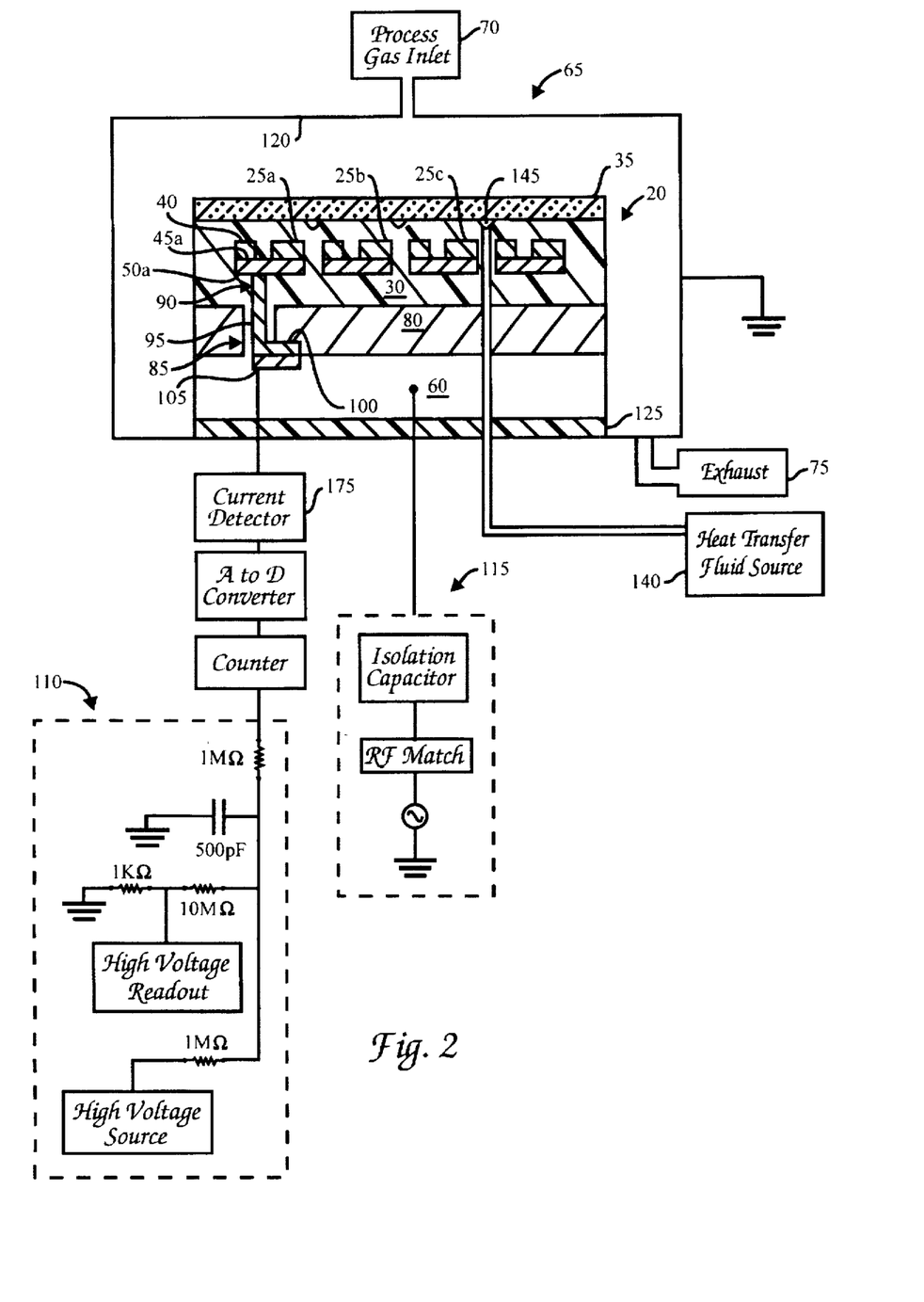
FIG. 2 is a partial sectional schematic side view of a process chamber showing operation of an electrostatic chuck of the present invention.

As illustrated in FIG. 2, the electrostatic chuck 20 is secured on a support 60 in a process chamber 65 that forms an enclosure for processing of the substrate 35. The process chamber 65 typically includes a process gas source 70 for introducing process gas into the chamber 65, and a throttled exhaust 75 for exhausting gaseous byproducts from the chamber 65. The particular embodiment of the process chamber 65 shown in FIG. 2 is suitable for plasma processing of substrates 35; however, the present invention can be used with other process chambers or processes without deviating from the scope of the invention.

Typically, the electrostatic chuck 20 comprises a base 80, with a bore 85 therethrough, that is useful for supporting the electrodes 25a–c and insulator 30. An electrical connector 90 electrically connects the power bus 40 to a voltage supply. The electrical connector 90 comprises (i) an electrical lead 95 that extends through the bore 85 of the base 80, and (ii) an electrical contact 100 that electrically engages a voltage supply terminal 105 at the interface between the base 80 and the support 60. A first voltage supply 110 provides an electrical voltage to the voltage supply terminal 105 for operating the chuck 20. The first voltage supply 110 typically includes a circuit which comprises a high voltage DC source of about 1000 to 3000 volts, connected to a high voltage readout, through a 10 MΩ resistor. A 1 MΩ resistor in the circuit limits current flowing through the circuit, and a 500 pF capacitor is provided as an alternating current filter. A second voltage supply 115 is connected to the support 60 in the process chamber 65. At least a portion of the support 60 is typically electrically conductive and functions as a process electrode, or cathode, for forming a plasma in the chamber 65. The second voltage supply 115 is provided for electrically biasing the support 60 with respect to an electrically grounded surface 120 in the chamber 65, to form an electric field that generates and/or energizes a plasma formed from the process gas in the chamber 65. An insulative flange 125 is disposed between the support 60 and the grounded surface 120 to electrically isolate the support 60 from the grounded surface 120. The second voltage supply 115 generally comprises an RF impedance that matches the impedance of the process chamber 65 to the impedance of the line voltage, in series with an isolation capacitor.

To operate the chuck 20, the process chamber 65 is evacuated and maintained at a sub-atmospheric pressure. A substrate 35 is placed on the chuck 20, and the electrodes 25a–c of the chuck 20 are electrically biased with respect to the substrate 35 by the first voltage supply 110. Thereafter, process gas is introduced into the chamber 65 via the gas inlet 70, and plasma is formed from the process gas by activating the second voltage supply 115 or by using alternative plasma generator sources, such as inductor coils (not shown). The voltage applied to the electrodes 25a–c causes electrostatic charge to accumulate in the electrodes 25a–c, and the plasma in the chamber 65 provides electrically charged species having opposing polarity which accumulate in the substrate 35. The accumulated opposing electrostatic charge results in an attractive electrostatic force that electrostatically holds the substrate 35 to the chuck 20.

To regulate the temperature of the substrate 35 held on the chuck 20, a heat transfer fluid source 140 can be used to supply heat transfer fluid to grooves 145 in the insulator 30. The substrate 35 held on the chuck 20 covers and seals the grooves 145, preventing heat transfer fluid from leaking out. The heat transfer fluid in the grooves 145 can be used to heat or cool the substrate 35 to regulate the temperature of the substrate 35 and maintain the substrate 35 at constant temperatures during processing. Typically, the grooves 145 form a pattern of intersecting channels extending through the insulator 30.

The multielectrode chuck 20 of the present invention is resistant to failures occurring from erosion or puncture of the insulator 30 on the electrodes 25a–c. When a sharp-edged fragment punctures the insulator 30 covering an electrode 25a, the electrostatic charge in the substrate 35 flows through the exposed electrode 25a and through the fuse 50a connected to the electrode. The current flowing through the fuse 50a as a result of the electrostatic discharge causes the fuse 50a to automatically switch-off in a relatively short time to electrically disconnect the electrode 25a from the output terminal 45a of the electrical power bus 40. However, the remaining electrodes 25b, 25c which are still insulated by the insulator 30 provide a large contact area of electrodes that continues to operate and electrostatically hold the substrate 35 to the chuck 20. Thus, each fuse 50a and electrode 25a assembly functions as an independently operated micro electrostatic chuck having a small contact area, and obtains its power supply from an independently powered output terminal 45a of the power bus 40. In this manner, the electrostatic chuck 20 of the present invention provides significant advantages by continuing to hold the substrate 35 and resisting catastrophic failure even when the insulator 30 covering an electrode 25a–c is punctured or eroded.

Figure 3:
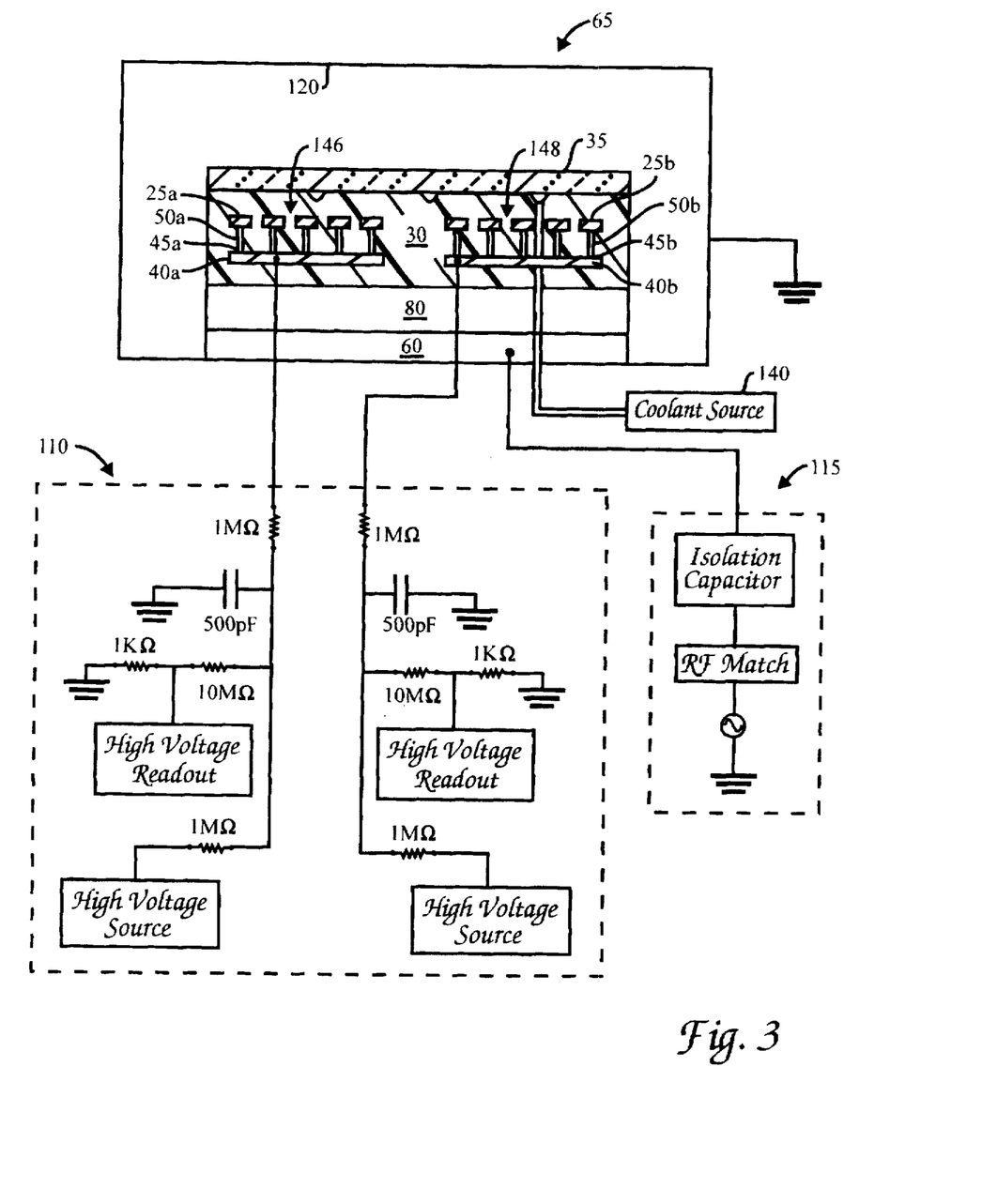
FIG. 3 is a partial sectional schematic side view of a process chamber showing operation of a bipolar electrostatic chuck of the present invention.

A bipolar version of the electrostatic chuck 20 of the present invention will now be described with reference to FIG. 3. In the bipolar version, the chuck 20 comprises an insulator 30 covering a first group of electrodes 146 and a second group of electrodes 148, sized and configured to serve as bipolar electrodes. The groups of electrodes 146, 148 are capable of electrostatically holding a substrate 35 when a voltage is applied thereto. A first power bus 40a having a first set of output terminals 45a provides voltage to the first group of electrodes 146. A second power bus 40b having a second set of output terminals 45b provides voltage to the second group of electrodes 148. A plurality of fuses 50a, 50b are provided, each fuse 50a electrically connecting at least one electrode 25a, 25b in series to an output terminal 45a, 45b from a power bus 40a, 40b. The fuses 50a, 50b are capable of electrically disconnecting the electrodes 25a, 25b from the output terminals 45a, 45b when the insulator 30 punctures and exposes the electrodes to the process environment causing a current to flow through the fuse 50.

In the bipolar version, the first voltage supply 110 provides a differential electrical voltage to the first and second power buses 40,40b.

In a preferred configuration, the first voltage supply 110 comprises two DC power supplies that provide a negative voltage to the first electrodes 146 and a positive voltage to the second electrodes 148 to maintain the electrodes at a differential electric potential relative to one another. The opposing electric potentials of the groups of electrodes 146, 148 induce opposing electrostatic charges in the groups of electrodes 146, 148, and in the substrate 35 held to the chuck 20, without use of a plasma in the process chamber 65, causing the substrate 35 to be electrostatically held to the chuck 20. Bipolar electrode configurations are advantageous for non-plasma processes in which there are no charged plasma species to serve as charge carriers for electrically biasing the substrate 35.

Alternate versions of the chuck 20 that allow ease of fabrication, increased reliability, and maximization of the electrostatic clamping force generated by the electrodes will now be described. In the version illustrated in FIG. 4, the electrical power bus 40 comprises an planar conductive layer spaced apart from the electrodes 25 that provides voltage for operating the electrodes 25. Each fuse 50 electrically connects, in series, at least one electrode 25 to the power bus 40. Preferably, the fuses 50 comprise a resistive coating 150 on a hole 155 that extends between an electrode 25 and the planar conductive layer, the resistive coating 150 comprising, for example, a thin coating of a conductive or resistive material that serves as a resistor element. This version has certain advantages of fabrication, because the resistive fuse elements can be easily fabricated by depositing the resistive coating 150 on holes 155 formed in an insulator 30 covering the planar conductive layer.

Figure 5:
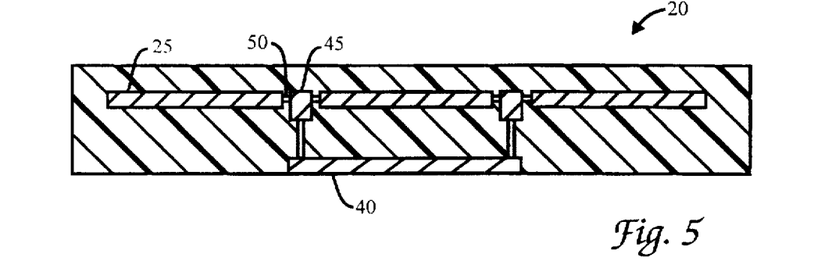

In the version shown in FIG. 5, the output terminals 45 of the electrical power bus 40 are substantially coplanar with the electrodes 25. The electrodes 25 are coplanar so that the electrostatic contact area of the electrodes 25 fall in a single plane. The output terminals 45 are positioned coplanar to the electrode plane, and lie between and spaced apart from the electrodes 25. This arrangement allows the fuses 50 to be positioned in between the electrodes 25, thereby reducing the total thickness of the electrode 25 and insulator layer 30, and maximizing the attractive electrostatic force of the chuck 20.

Figure 6:
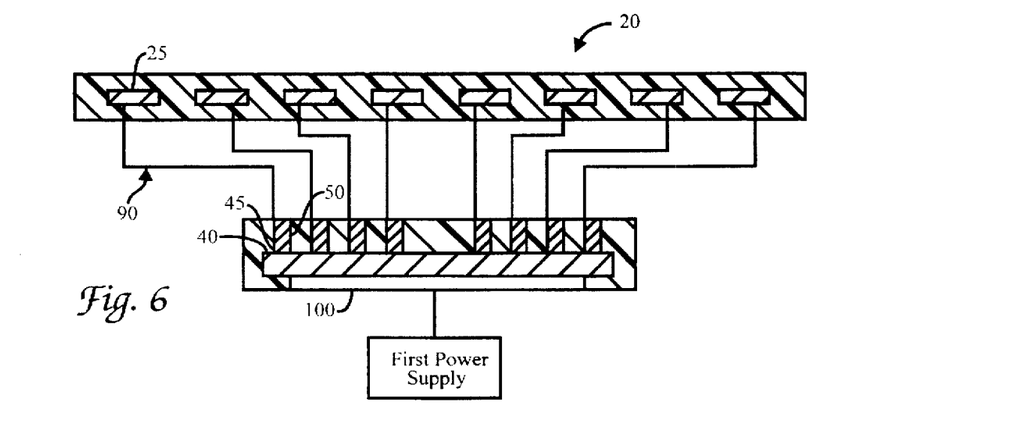

In the configuration shown in FIG. 6, the electrical connector 90, electrical power bus 40, and fuses 50, form a unitary structure. An electrical conductive plate has (i) an exposed portion that serves as the electrical contact 100, and (ii) an insulated portion on the opposing side of the exposed electrical contact 100 serves as the electrical power bus 40. The fuses 50 are embedded in the insulated portion opposing the exposed electrical contact 100 and are electrically connected to the output terminals 45 of the power bus 40. The electrically conductive plate with the insulated fuses 50 and power bus 40 forms an unitary structure that can be easily replaced when the fuses burn-out.

Figure 7:
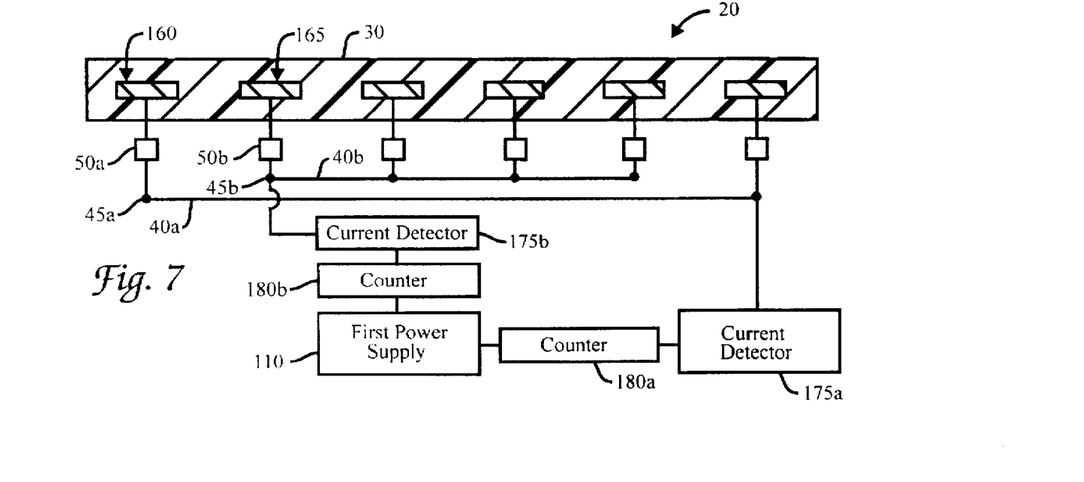

In the version shown in FIG. 7, the chuck 20 comprises (i) peripheral electrodes 160 in a periphery of the insulator 30, and (ii) central electrodes 165 in central portion of the insulator 30. A first power bus 40a having a first set of output terminals 45a provides voltage to the peripheral electrodes 160, and the second power bus 40b having a second set of output terminals provides voltage to the central electrodes 165. Fuses 50a, 50b electrically connect the electrodes 160, 165 in series to output terminals 45a, 45b from the power buses 40a, 40b, as shown. The fuses 50a are capable of electrically disconnecting the peripheral electrodes 160 from the power bus 40a when any one peripheral electrodes 160 is exposed to the process environment. This version allows separate monitoring and supplying of voltage to the peripheral electrodes 160 and central electrodes 165. The peripheral electrodes are particularly important when heat transfer fluid is used to regulate the temperatures of the substrate 35 held on the chuck 20, because the peripheral electrodes 160 seal the periphery of the chuck preventing leakage of heat transfer fluid. When the peripheral electrodes 160 fail, the heat transfer fluid held below the substrate leaks out, causing excessive heating and resultant damage to the periphery of the substrate. This chuck configuration allows application of higher voltage to the peripheral electrodes 160 to provide increased electrostatic holding force at the periphery of the chuck, or replacement of the chuck, if one or more of the peripheral electrodes 160 is exposed to the plasma environment.

Another aspect of the invention provides a system for early detection, and optional counting, of the number of electrode failures. In this system, a current detector 175 is electrically connected in series to the electrical power bus 40, as shown in FIG. 1a, to detect the flow of current through the fuses 50. When an insulator 30 punctures and exposes an electrode 25a to the process environment, electrostatic charge in the substrate 35 discharges as a current flowing through the electrode 25a and through the contiguous fuse 50a. The current detector 175 detects the current before the fuse 50a electrically disconnects the electrode 25a from the output terminal 45a of the power bus 40. A suitable current detector 175 comprises an ammeter connected in series to the electrical power bus 40. Monitoring of the current surges through the current detector 175 provides an indication of the number of electrodes 25 exposed to the process environment or the number of disconnected electrodes 25. In this manner, the current detector 175 can be used to provide early warning of the failure of one or more electrodes 25, to allow replacement of the chuck before catastrophic failure occurs during a processing cycle. Conventional current detectors, such as amp-meters, can be used.

Preferably, an electrical counter 180 is connected to the current detector 175 to count the number of current surges through the current detector 175 to provide an estimate of the number of electrodes 25 exposed to the process environment, or the number of disconnected electrodes 25. The counter 180 can be a conventional counter capable of counting the number of current discharges through the current detector 175. A counter typically comprises a register that counts the impulses generated by an analog-to-digital convertor and generates a position reading. Optionally, an analog-to-digital convertor 185 is used in series before the counter 180 to convert the analog current output to a digital current output. A typical analog-to-digital convertor 185 comprises an electronic circuit that receives a magnitude-scaled analog voltage and generates a binary-coded number proportional to the analog input. The analog-to-digital convertor 185 provides the binary output indicative of the analog input at precise repetitive time intervals. Conventional electrical counters and analog-to-digital converters can be used.

In the version of the chuck illustrated in FIG. 7, separate current detectors 175a, 175b, and optionally separate electrical counters 180a, 180b, are used to detect current flow in the peripheral electrodes 160 and central electrodes 165 of the chuck 20, respectively. The use of two current detectors allows separate detection of failure of the peripheral electrodes 160 and central electrodes 165. In this manner, the current detector 175a can be used to provide early warning of the failure of one or more peripheral electrodes 25, to allow replacement of the chuck before the chuck 20 fails during a processing cycle.

The different features and components of the chuck 20 and illustrative methods of fabricating the chuck will now be described.

However, other methods of fabrication can be used to form the chuck 20, and the present invention should not be limited to the illustrative methods described herein.

The base 80 of the chuck 20, used to support the electrode 25 and insulator 30, is typically shaped and sized to correspond to the shape and size of the substrate 35 to maximize heat transfer and provide a wide holding surface. For example, if the substrate 35 is disk shaped, a right cylindrically shaped base 80 is preferred. Typically, the base 80 is of aluminum and has a cylindrical shape with a diameter of about 100 mm to 225 mm, and a thickness of about 1.5 cm to 2 cm. The top and bottom surfaces of the plate are ground using conventional grinding techniques, until the surface roughness of the plate is less than 1 µm, so that the base 80 can uniformly contact the support 60 and the substrate 35, to allow efficient thermal transfer between the substrate 35 and the support 60. The base 80 also has bores sized sufficiently large to insert the electrical connector 90 therethrough with minimal clearance, a suitable clearance being less than about 5 mm.

The insulator 30 can be a unitary insulator 30 sheet sized sufficiently large to cover and enclose all the electrodes 25 of the chuck 20 (as shown), or each electrode 25 can be separately covered by a segment of insulator 30 (not shown). The resistivity of the insulator 30 should be (i) sufficiently low to allow rapid electrostatic charge accumulation and dissipation to provide a rapid response time, and (ii) sufficiently high to prevent leakage of the voltage applied to the electrodes 25 which can damage the devices formed on the substrate 35. Typically, the insulator 30 has a resistivity ranging from about $10^{13}$ σ cm to $10^{20}$ σ cm, and a dielectric constant of at least about 3, and more preferably at least about 4. A suitable thickness of the insulator 30 depends on the electrical resistivity and dielectric constant of the insulator. For example, when the insulator 30 has a dielectric constant of about 3.5, the thickness of the insulator 30 is typically about 10 μm to about 500 μm, and more typically from about 100 μm to about 300 μm. Suitable insulator 30 materials have dielectric breakdown strengths of typically at least about 3.9 volts/micron (100 volts/mil), and more typically at least about 39 volts/micron (1000 volts/mil).

In a preferred configuration, the insulator 30 comprises a two layer laminate structure, that includes (i) a first insulator layer 30a below the electrodes 25, and (ii) a second layer insulator 30b over the electrodes 25, as illustrated in FIGS. 8a–8f. Preferably, each insulator layer 30a, 30b has a substantially equivalent thicknesses ranging from about 50 μm to about 100 μm.

Preferably, the insulator 30 comprises an electrically insulative polymeric material, such as polyimide, polyketone, polyetherketone, polysulfone, polycarbonate, polystyrene, nylon, polyvinylchloride, polypropylene, polyetherketones, polyethersulfone, polyethylene terephthalate, fluoroethylene propylene copolymers, cellulose, triacetates, silicone, and rubber. More preferably, the insulator 30 comprises polyimide having a high dielectric breakdown strength, ranging from 5,000 to 10,000 volts per mil, which allows use of thin insulator 30 layers thereby maximizing electrostatic attractive force. Also, polyimide is resilient enough to deform slightly under the electrostatic clamping pressure to provide enhanced heat transfer when a heat transfer fluid is introduced in the microscopic gap between the substrate 35 and the resilient polyimide. Polyimide dielectric layers are typically formed by spin coating or bonding of a polyimide film over an electrode 25.

Alternatively, the insulator 30 can comprise a ceramic material, including (i) oxides such as $Al_2O_3$, BeO, $SiO_2$, $Ta_2O$, $ZrO_2$, CaO, MgO, $TiO_2$, $BaTiO_3$, (ii) nitrides such as AlN, TiN, BN, $Si_3N_4$), (iii) borides such as $ZrB_2$, $TiB_2$, $VB_2$, $W_2B_3$, $LaB_6$, (iv) silicides such as $MoSi_2$, and (v) diamond. The ceramic insulator is typically formed by either sputtering, flame spraying, CVD, or by solution coating, a thin ceramic film onto the electrode surface. Alternatively, the ceramic insulator can be formed by sintering a ceramic block with the electrodes 25 embedded therein.

Preferably, the insulator 30 is resistant to temperatures in excess of 50° C., and more preferably in excess of 100° C., so that the chuck 20 can be used for high temperature processes. Also, preferably, the insulator 30 has a high thermal conductivity so that heat generated in the substrate 35 during processing can dissipate through the chuck 20, a suitable thermal conductivity being at least about 0.10 Watts/mk/°K. The insulator 30 can also have dispersed therein a high thermal conductivity powder filler material, such as diamond, alumina, zirconium boride, boron nitride, and aluminum nitride, having an average particle size of less than about 10 μm, to increase the thermal conductivity and erosion resistance. Preferably, the volumetric ratio of the filler to insulator 30 is from about 10% to 80%, and more typically from 20% to 50%. Additionally, a protective coating (not shown) can be applied on the insulator 30 to protect the insulator 30 from chemical erosion when the chuck 20 is used in erosive processing environments.

The electrodes 25 are made from an electrically conductive material, such as for example, metals such as copper, nickel, chromium, aluminum, and alloys thereof. Typically, the thickness of the electrodes 25 is from about 1 m to about 100 μm, and more typically from 1 μm to 50 μm. Preferably, each electrode 25 comprises a contact area of from about $10^{-4}$ to $10^{-1}$ times the area of the substrate 35. For a substrate 35 having a diameter of 200 to 300 mm (6 to 8 inches), preferably each electrode 25 comprises a contact area of at least about 20 sq mm, and more preferably from about 50 to about 1000 sq mm.

Figures 9A, 9B:
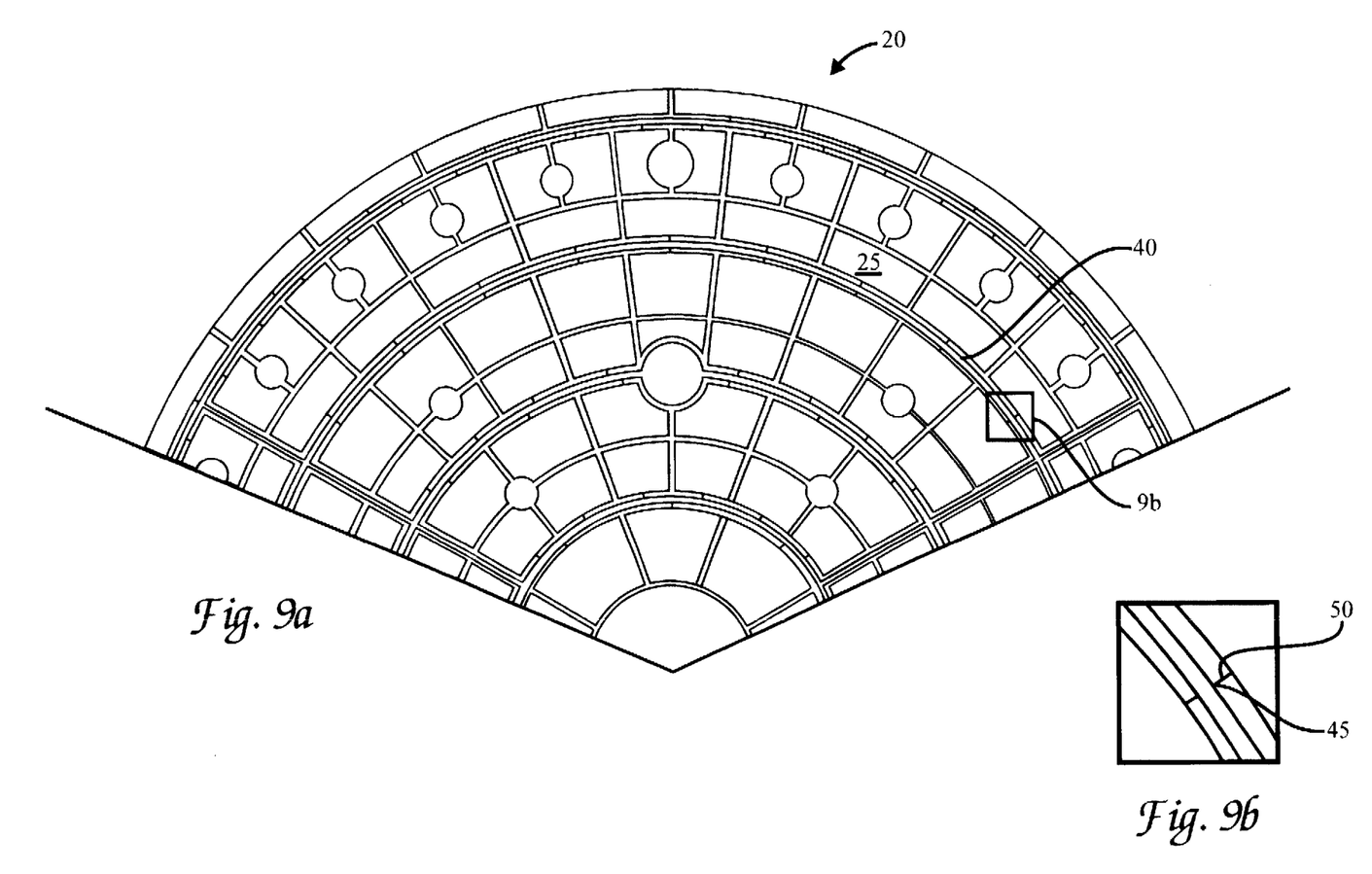
FIG. 9a is a schematic top view of an electrode, power bus, and fuse assembly of the electrostatic chuck manufactured using the process illustrated in FIGS. 8a–8f.
FIG. 9b is an enlarged schematic view of the inset box 9b of FIG. 9a showing details of the electrode, power bus, and fuse assembly.

The shape and size of the area covered by the electrodes 25 varies according to the size and shape of the substrate 35. For example, as shown in FIG. 9a, if the substrate 35 is disk shaped, the electrodes 25 are arranged in a disk shaped configuration to maximize the total area of the electrode 25 below the substrate 35. Preferably, the electrodes 25 cover a total area of about 50 to about 500 sq cm, and more typically from 80 to 380 sq cm.

Figure 10:
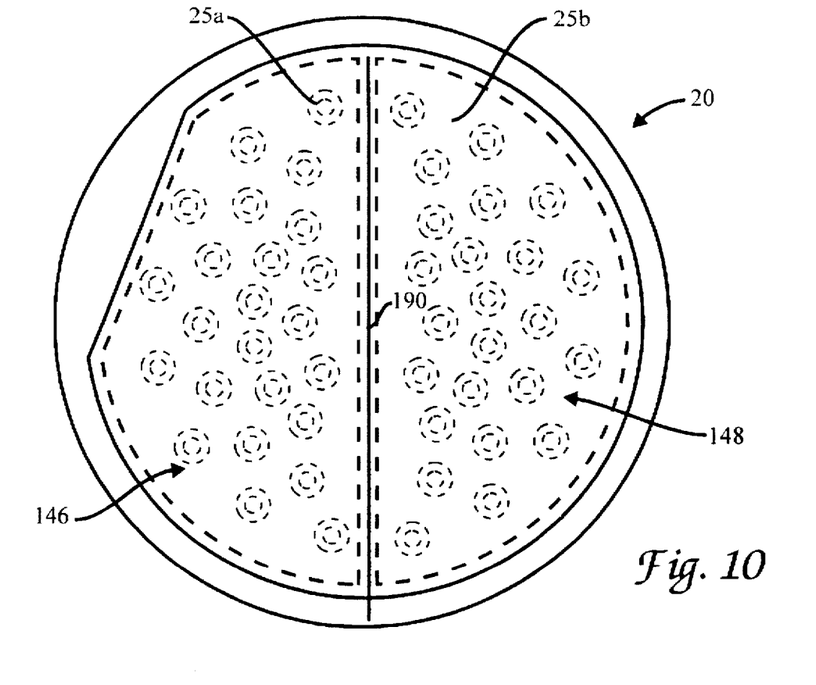
FIG. 10 is a schematic top view of a bipolar electrostatic chuck having two semicircular groups of electrodes.
Figure 11:
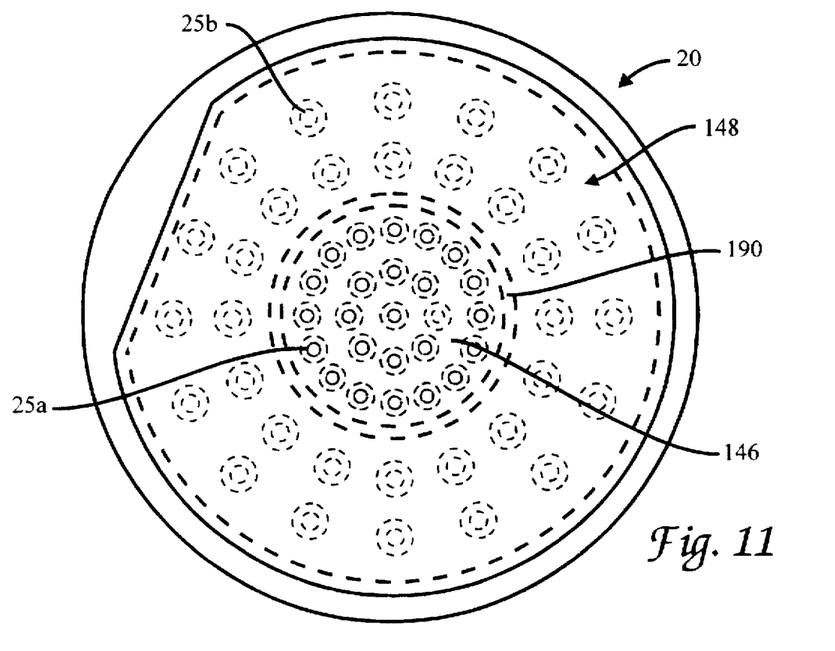
FIG. 11 is a schematic top view of another bipolar electrostatic chuck having a double ring electrode configuration.

For the bipolar electrode configurations, the contact areas of each group of electrodes 146, 148 are substantially equivalent and coplanar to one another, so that the electrodes 146, 148 generate equivalent electrostatic clamping forces on the substrate 35. Typically, the contact area of each group of electrodes is from about 50 to about 250 sq cm, and more preferably from about 100 to 200 sq cm. The first and second electrodes groups 146, 148 can cover a semicircular area, as shown in FIG. 10. Alternatively, the first group of electrodes 146 can comprise at least one inner ring of electrodes, and the second group of electrode 148 can comprise at least one outer ring of electrodes, as shown in FIG. 11.

Electrical isolation voids 190 are used to electrically isolate the groups of electrodes 146, 148 from one another. In one advantageous configuration, the electrical isolation voids 190 are sized and configured to serve as grooves for holding heat transfer fluid for regulating the temperature of the substrate 35 on the chuck 20. The grooves can be formed in the isolation voids 190 by cutting through the insulator 30 overlying the isolation void so that the grooves extend through the insulator 30, or the insulator 30 can recede into the isolation voids 190 to form grooves positioned between the electrodes as shown in FIG. 2. This configuration allows use of the isolation voids 190 between the electrodes to hold heat transfer fluid without necessitating additional grooves to be cut through the electrodes, thereby maximizing the effective area and electrostatic force of the electrodes 25.

Electrical connectors 90 are used to electrically connect the electrical power bus 40, or the first and second power buses 40a, 40b, to the first voltage supply 110. For the bipolar electrodes, separate electrical connectors 90 are used to separately electrically connect the first group of electrodes 146 to the first power bus 40a, and connect the second group of electrodes 148 to the second power bus 40b. For both monopolar and bipolar electrodes, the electrical connectors 90 are substantially identical and to avoid repetition will only be described once. The electrical connector 90 comprises an (i) electrical lead 95 that extends through the bore 85 in the base 80, and (ii) an electrical contact 100. Typically, the length of the electrical lead 95 is from about 10 mm to about 50 mm, and the width of the electrical lead 95 is from about 2 mm to about 10 mm. Preferably, the electrical contact 100 is disk-shaped with an exposed area sized to directly contact and electrically engage a voltage supply terminal 105, the area preferably being from about 50 to about 400 sq mm.

Each fuse 50 is self-operating and capable of electrically disconnecting at least one electrode 25 from an output terminal of the power bus when a current flows through the electrode 25 and contiguous fuse 50. The fuses 50 are current-sensitive elements capable of automatically electrically disconnecting the electrode 25 from an output terminal 45 when a current flows therethrough. When an insulator 30 punctures and exposes an electrode 25 to the process environment, electrostatic charge in the substrate 35 discharges as a current flowing through the electrode 25 and contiguous fuse 50, causing the fuse to switch-off, for example by melting or burning out. Typically, each fuse comprises a conductor having a reduced cross-section surrounded by an insulator. The ampere rating of the fuse 50 indicates the current the fuse can carry without burning-out, melting, or exceeding specific temperature rise limits. The interrupting rating of the fuse 50 defines the maximum short-circuit current that a fuse can safely interrupt. An instantaneous rise in current causes the fuse to switch-off usually in less than a quarter of a cycle. Preferably, each fuse 50 is capable of electrically disconnecting an electrode 25 from an output terminal 45 when a current of at least about 300 microamps, more typically at least about 500 microamps, and most typically at least about 1 milliamp, flows through the fuse 50. Most preferably, the fuse is constructed to switch-off at at least about 500 microamps, to disconnect the electrode 25 from the electrical power bus 40 in a relatively short time. Preferably, the fuse should be constructed to burn-out in less than about 100 milliseconds, and more preferably in less than 10 milliseconds.

In a preferred configuration, each fuse 50 comprises a resistor or resistive element having a resistance of at least about 100 σ, more preferably from about 100 to 3000 σ, and most preferably about 300 σ. The resistor can comprise a thin lead or layer of a resistive material connecting an electrode 25 to an output terminal 45 of power bus 40. It should be understood that the resistor can be made of a conductive or resistive material, because the resistance of a conductor is given by the formula $R = p \times (l/A)$, where $p$ is the resistance per unit length, $l$ is the length, and $A$ is the area of the element. Thus, even highly conductive material can operate as a resistor if the length of the material is suitably long or its area sufficiently small. For example, the resistor can comprise a conductive metal, such as copper or aluminum, formed as a very thin lead or layer connecting an electrode 25 to an output terminal 45. Alternatively, the resistor can be fabricated from conventional resistive materials, including carbon, nickel, phosphorous, chromium, tin, and mixtures thereof. Preferably, the resistor material is fabricated from nickel-phosphorous, nickelchromium, chromium, or tin, which are highly current sensitive materials.

The shape and size of the fuse 50, namely the length, width, diameter, or thickness of the fuse is dependent upon the fuse material and the amperage of the current flowing through the fuse. Preferably, the fuse is configured so that after the fuse 50 melts or burns out a continuous void is formed where the fuse used to be. The void should be sufficiently large to electrically isolate the output terminal 45 of the power bus 40 from the failed electrode 25 to prevent arcing and discharge of current from the output terminal 45 to the electrode 50. For example, a suitable thickness for a resistor fuse 50 constructed from a resistive material such as nickel-phosphorous, nickel-chromium, chromium or tin, is from about 50 æ to about 10,000 æ, and more preferably from about 100 æ to about 2,000 æ. In a preferred configuration, the fuse comprises a thin lead of resistive material connecting an electrode 25 to an output terminal 45 over a power bus 40.

The thin lead burns out or melts when the ampere rating of the current flowing through the resistive lead exceeds the maximum current that the fuse can conduct without burning out or melting, as described above. Furthermore, for fuses having thicknesses of the about 200 to 1000 æ, a preferred width is from about 0.1 to about 1 mm, and more preferably from 0.1 to 0.3 mm (0.005 to 0.012 inch); and a preferred length is from about 0.1 to 5 mm, and more preferably, from 0.5 to 2.5 mm (0.02 to 0.1 inch).

The resistive fuse element 50 can be embedded in the insulator 30 surrounding the electrodes 25, or can be constructed as a separate insulated fuse assembly, as described in more detail below.

Figure 4:
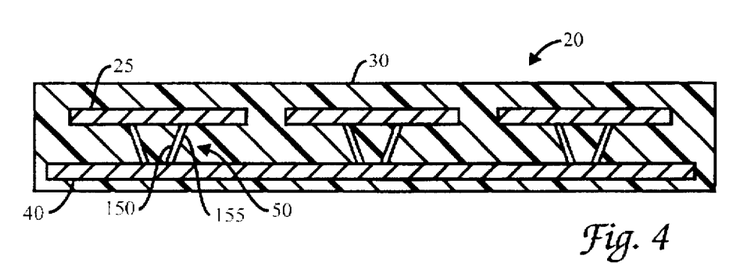

The electrical power bus 40 can comprise an electrical wire or electrical conductor layer embedded in the insulator 30 and spaced apart from the electrodes 25. The electrical power bus 40 has output terminals 45 or junctions that provide electrical voltage to the electrodes 25. The output terminals 45 of the electrical power bus 40 can be positioned below the electrodes 25, as shown in FIG. 4, or positioned coplanar to and between the electrodes 25, as shown in FIG. 5. Alternatively, the output terminals 45 and the electrical power bus 40 can be located in a different structure, or remote from the chuck 20, as shown in FIGS. 6 and 7. Methods of manufacturing the electrodes 25, electrical power bus 40, and fuses 50 of the chuck will now be described. Preferably, the chuck is fabricated as a laminate comprising an insulator 30 with the electrodes 25, electrical power bus 40, and fuses 50 embedded therein. In one method of fabrication, schematically illustrated in FIGS. 8a–8f, a composite layer is formed by (i) selecting a first insulator layer 30a; (ii) depositing a resistor layer 200 on the first insulator layer 30a to form the fuses 50 therefrom; and (iii) depositing an electrical conductor layer 205 over the resistor layer 200, to form the electrodes 25 and power bus 40. The insulator layer 30a can comprise commercially available polymer films such as "KAPTON," a polyimide film manufactured by DuPont de Nemours Co., in Wilmington, Delaware; "APIQUEO" fabricated by Kanegafuchi Chemical Indus., Japan; "UPILEX" manufactured by Ube Indus. Ltd., Japan; "NITOMID" fabricated by Nitto Electric Indus. Co. Ltd., Japan; or "SUPERIOR FILM" fabricated by Mitsubishi Plastics Indus. Ltd., Japan.

Figure 8A:
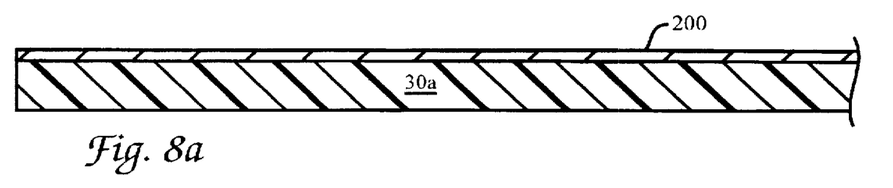
FIGS. 8a–8f are sectional schematic side views showing successive steps in the fabrication of a version of the electrostatic chuck of the present invention.
Figure 8B:
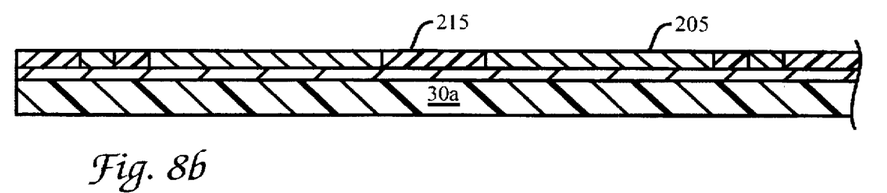

Preferably, the resistor layer 200 can be formed by sputtering a thin layer of a conductive or resistive material, preferably, nickel-phosphorous, nickel-chromium, chromium, or tin, on the first insulator layer 30a, , as shown in FIG. 8a. The thickness of the resistor layer is from about 50 æ to about 10,000 æ. A first patterned resist layer 215 is formed on the resistor layer 200, the resist layer 215 being patterned to the electrode 25 and electrical power bus 40 configurations. The resist can comprise photoresist materials, such as "RISTON" fabricated by DuPont de Nemours Chemical Co., Wilmington, Delaware. Conventional photolithographic methods, such as those described in *Silicon Processing for the VLSI Era, Volume 1: Process Technology*, Chapters 12, 13, and 14, by Stanley Wolf and Richard N. Tauber, Lattice Press, California (*1986*), which is incorporated herein by reference, can be used to pattern the resist layer 215 to correspond to the shape of the electrodes 25 and electrical power bus 40. Thereafter, electroplating is used to deposit an electrical conductor layer 205 between the resist coated portions, to form the electrodes 25, electrical power bus 40, and electrical connector 90 as shown in FIG. 8b. The electrical conductor layer 205 is deposited to a thickness of 2 μm to 100 μm, and more preferably about 5 μm. The electrical conductor layer 205 can also be deposited by sputtering a copper layer on the insulator film with a chromium oxide bonding layer therebetween. The vapor deposition method is advantageous by allowing deposition of a thin electrode layer that has a thickness of less than about 500 nm, and more preferably less than 250 nm.

Figure 8C:
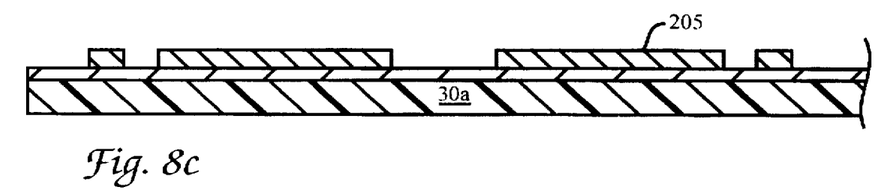

After depositing the electrical conductor layer 205, residual photoresist is stripped from the composite layer using a conventional acid or oxygen plasma stripping process to obtain the structure shown in FIG. 8c.

Figure 8D:
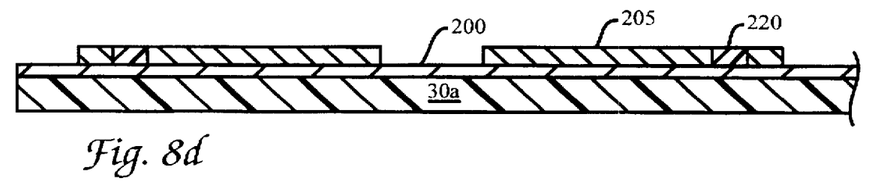
Figure 8E:
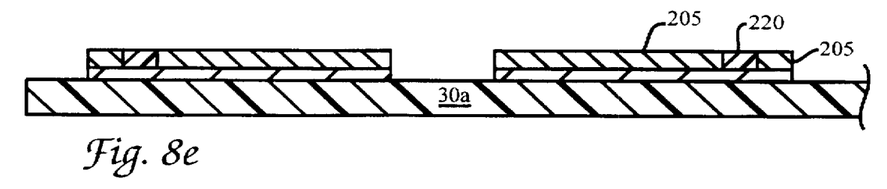
Figure 8F:
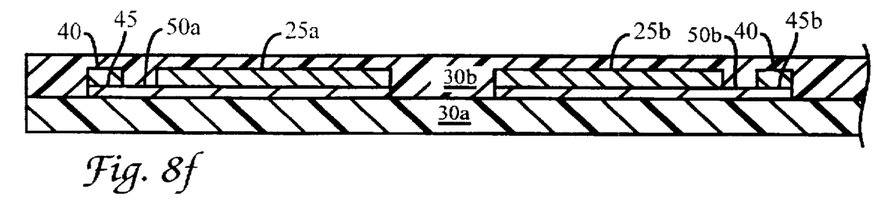

Thereafter, a second patterned resist layer 220 is formed on the resistor layer 200, as shown in FIG. 8d, the patterned resist features corresponding to the desired fuse 50 configuration. Exposed portions of the resistor layer 200 are then etched using conventional etching methods to form resistive fuses 50 connecting the electrodes 25 to the electrical power bus 40, as shown in FIG. 8e. Conventional wet or dry chemical etching methods can be used to etch the resistor layer 200. A suitable wet chemical etching method comprises immersing the composite film into an etchant such as ferric chloride, sodium persulfate, or an acid or base, until the film is etched. Suitable dry etching processes are described in Silicon Processing, Chapter 16, supra, which is incorporated herein by reference. Thereafter, residual photoresist is stripped from the laminate, and a second insulator layer 30b is then formed over the etched electrical conductor and resistor layers to electrically insulate the etched composite film, as show in FIG. 8f. The second insulator layer 30b can be adhered over the etched conductor and resistor layers so that the etched layers are embedded in the insulator 30 to form the chuck 20.

The electrical connector 90 of the electrostatic chuck 20 is typically formed as an integral extension of the electrodes 25 by stamping, punching, or pressing out the electrical connector 90 from the laminate.

Preferably, the electrical connector 90 is cut out so that the electrical lead 95 and contact 100 are disposed within one of the grooves 145. After cutting out the electrical connector 90, the insulator 30 on the electrical contact is removed to expose the underlying electrically conductor layer 205 which forms the electrical contact 100. The electrical lead 95 and electrical contact 100 are inserted through the bore in the base 80 so that the electrical contact 100 is disposed below the base 80 as shown in FIG. 2.

The chuck laminate structure can be then adhered to the base 80 of the chuck 20, using conventional pressure or temperature sensitive adhesives, such as polyimides. A top view of the resultant chuck 20 is shown in FIGS. 9a and 9b.

Instead of fabricating the composite laminate layer, a commercially available composite multi-layer film comprising a first insulator layer 30 having thereon (i) a resistor layer 200, and (ii) an electrical conductor layer 205, can also be used. A suitable multilayer film comprises a "R/FLEX 1100" film fabricated by Rogers Corporation, Chandler, Arizona, comprising a 125 μm thick polyimide insulator layer 30a, a 0.1 μm resistor layer 200, and an 25 μm electrically conductive copper layer 205. The resistor layer 200 is etched or milled to form the resistive fuses 50, and the copper layer is etched or milled to form the electrodes 25, the integral electrical connector 90, and electrical power bus 40, as described above. Thereafter, a second insulator layer 30b is adhered over the etched laminate structure to form the chuck 20.

The electrostatic chuck 20 having features of the present invention has several advantages. First, the chuck is resistant to failures occurring from erosion or puncture of the insulator 30 on the electrodes 25. The current flowing through a fuse 50 as a result of the electrostatic discharge through an exposed electrode 25 causes the fuse 50 to electrically disconnect the exposed electrode 25 in a relatively short time. This allows the remaining insulated electrodes 25 to continue to operate and electrostatically hold the substrate 35. Thus, each fuse 50 and electrode 25 assembly of the present functions as an independently operated micro chuck.

In this manner, the electrostatic chuck 20 of the present invention resists catastrophic failure even when insulator 30 covering an electrode 25 is punctured or eroded.

In another aspect the present invention provides a system for early detection, and optional counting, of the number of electrode 25 failures using a current detector 175, and optional counter 180, electrically connected in series to the electrical power bus 40 to detect flow of current through the fuses 50. Monitoring of the current surges through the current detector 175 provides an indication of the number of electrodes 25 exposed to the process environment or the number of disconnected electrodes 25. In this manner, the current detector 175 and counter 180 can be used to provide early warning of the failure of one or more electrodes 25, to allow replacement of the chuck before the chuck catastrophically fails during a processing cycle.

Although the present invention has been described in considerable detail with reference to certain preferred versions, many other versions should be apparent to those skilled in the art. Therefore, the spirit and scope of the appended claims should not be limited to the description of the preferred versions contained herein.

What is claimed is:

1. A failure resistant electrostatic chuck for holding a substrate in a process environment, the chuck comprising:
   (a) a plurality of electrodes covered by insulator, the electrodes capable of electrostatically holding a substrate when a voltage is applied thereto;
   (b) an electrical power bus having a plurality of output terminals for conducting voltage to the electrodes; and
   (c) a plurality of fuses in the insulator, each fuse electrically connecting at least one electrode in series to an output terminal from the power bus.

2. The electrostatic chuck of claim 1, wherein the fuses are capable of electrically disconnecting the electrodes from the output terminals, when the insulator punctures and exposes the electrodes to the process environment causing a current to flow through the fuses.

3. The electrostatic chuck of claim 2, wherein each fuse comprises a conductor having at least one of the following characteristics:
   (a) the conductor is self-operating and capable of electrically disconnecting at least one electrode from an output terminal of the power bus;
   (b) the conductor is capable of electrically disconnecting an electrode from an output terminal of the power bus when a current of at least about 500 microamps flows through the fuse; or
   (c) the conductor is capable of burning out in less than about 10 milliseconds.

4. The electrostatic chuck of claim 1, wherein each fuse comprises a resistor having a resistance of at least about 100 σ.

5. The electrostatic chuck of claim 1, wherein each fuse is constructed from a material comprising carbon, nickel, phosphorous, chromium, tin, and mixtures thereof.

6. The electrostatic chuck of claim 1, wherein each fuse is constructed from a material selected from the group consisting of nickelphosphorous, nickel-chromium, chromium, or tin.

7. The electrostatic chuck of claim 1, wherein each fuse comprises a resistor having at least one of the following dimensions:
   (a) a thickness of from about 50 æ to about 10,000 æ;
   (b) a length from about 0.1 to 5 mm; or (c) a width of from about 0.1 to 1 mm.

8. The electrostatic chuck of claim 1, wherein the electrical power bus comprises:

(a) an electrical wire embedded in the insulator; and (b) an electrical conductor layer, spaced apart from the electrodes, and embedded in the insulator.

9. The electrostatic chuck of claim 8, wherein each fuse comprises a coating of a resistive material on a via between the electrode and the electrical conductor layer.

10. The electrostatic chuck of claim 8, wherein the electrical conductor layer comprises an exposed conductive portion sized to serve as a contact for electrically connecting the electrical conductor layer to a voltage terminal in the process environment.

11. The electrostatic chuck of claim 1, wherein the electrical power bus comprises (i) an electrical lead, and (ii) an electrical contact having an exposed contact area sized sufficiently large to directly contact and electrically engage a voltage supply terminal in the process environment.

12. The electrostatic chuck of claim 11, wherein the electrical contact further comprises an electrical insulator having the fuses embedded therein.

13. The electrostatic chuck of claim 1, wherein the output terminals of the power bus are positioned coplanar with, and spaced apart from, the electrodes.

14. The electrostatic chuck of claim 1, wherein each electrode comprises a contact area of from about $10^{-4}$ to $10^{-1}$ times the area of the substrate.

15. The electrostatic chuck of claim 14, wherein each electrode comprises a contact area of from about 50 to 1000 sq mm.

16. The electrostatic chuck of claim 1, wherein the electrodes comprise first and second groups of electrodes that are sized and configured to operate as bipolar electrodes.

17. The electrostatic chuck of claim 16, wherein the electrical power bus comprises (i) a first power bus having a first set of output terminals for providing voltage to the first group of electrodes, and (ii) a second power bus having a second set of output terminals for providing voltage to the second group of electrodes.

18. The electrostatic chuck of claim 16, wherein the first and second groups of electrodes have at least one of the following characteristics:

(a) the first and second groups of electrodes are coplanar to one another and have substantially equivalent areas;

(b) the first and second groups of electrodes each cover a semicircular area; or (c) the first group of electrodes comprise at least one inner ring of electrodes, and the second group of electrode comprise at least one outer ring of electrodes.

19. The electrostatic chuck of claim 1, wherein the electrodes are electrically isolated from one another by at least one electrical isolation void that is sized and configured to serve as a groove for holding a heat transfer fluid for transferring heat to and from the substrate.

20. The electrostatic chuck of claim 1, wherein the insulator comprises at least one of the following characteristics:

(a) a dielectric breakdown strength of at least about 1000 volts/mil;

(b) the insulator is made of a ceramic or polymer;

(c) the insulator has a resistivity of from about $10^{13}$ σ cm to $10^{20}$ σ cm; or (d) the thicknesses of insulator covering the electrodes is from about 25 µm to about 250 µm.

21. A method of detecting failure of electrodes in an electrostatic chuck, the method comprising the steps of:

(a) electrostatically holding a substrate on the chuck of claim 1 in an electrically charged process environment; and (b) detecting a current discharge through a fuse that results after puncturing of the insulator on an electrode of the chuck.

22. A failure resistant electrostatic chuck for holding a substrate in a process environment, the chuck comprising:

(a) first and second groups of electrodes covered by insulator, the electrodes sized and configured to serve as bipolar electrodes, and capable of electrostatically holding a substrate when a voltage is applied thereto;

(b) first and second electrical power buses, the first power bus having a first set of output terminals for providing voltage to the first group of electrodes, and the second power bus having a second set of output terminals for providing voltage to the second group of electrodes; and (c) a plurality of fuses in the insulator, each fuse electrically connecting at least one electrode in series to an output terminal from a power bus, the fuses capable of electrically disconnecting the electrode from the output terminal when the insulator punctures and exposes the electrode to the process environment causing a current to flow through the fuse.

23. The electrostatic chuck of claim 22, wherein the first and second groups of electrodes have at least one of the following characteristics:

(a) the first and second electrodes groups of electrodes are coplanar to one another and have substantially equivalent areas;

(b) the first and second groups of electrodes each cover a semicircular area; or (c) the first group of electrodes comprise at least one inner ring of electrodes, and the second group of electrodes comprise at least one outer ring of electrodes.

24. A failure resistant electrostatic chuck for holding a substrate in a process environment, the chuck comprising an electrical insulator including:

(a) a plurality of electrodes capable of electrostatically holding a substrate when a voltage is applied thereto;

(b) an electrical conductor layer spaced apart from the electrodes, the conductor layer provided for conducting voltage for operating the electrodes; and (c) a plurality of fuses, each fuse electrically connecting in series at least one electrode to the conductor layer, the fuses capable of electrically disconnecting the electrode from the conductor layer when the insulator on the electrode punctures and exposes the electrode to the process environment.

25. The electrostatic chuck of claim 24, wherein the fuses comprise a coating of resistive material on a via between an electrode and the conductor layer.

26. A failure resistant electrostatic chuck for holding a substrate in a process environment, the chuck comprising an electrical insulator including:

(a) a plurality of planar electrodes capable of electrostatically holding a substrate when a voltage is applied thereto;

(b) an electrical power bus capable of conducting voltage to output terminals for operating the electrodes, the output terminals being substantially coplanar with the electrodes; and (c) a plurality of fuses, each fuse electrically connecting at least one electrode in series to an output terminal of the power bus, the fuses capable of electrically disconnecting the electrode from the power bus when the electrode is exposed to the process environment.

27. The electrostatic chuck of claim 26, wherein at least a portion of the output terminals are positioned between, and spaced apart from, the electrodes.

28. The electrostatic chuck of claim 27, wherein the fuses are coplanar with the electrodes.

29. A failure resistant electrostatic chuck for holding a substrate in a process environment, the chuck comprising:
   (a) a plurality of electrodes having insulator thereon and capable of electrostatically holding a substrate when a voltage is applied thereto, the electrodes comprising (i) peripheral electrodes in a periphery of the insulator, and (ii) central electrodes in a central portion of the insulator;
   (b) first and second electrical power buses, the first power bus having a first set of output terminals for providing voltage to the peripheral electrodes, and the second power bus having a second set of output terminals for providing voltage to the central electrodes; and
   (c) a plurality of fuses in the insulator, each fuse electrically connecting at least one electrode in series to an output terminal from a power bus, the fuses capable of electrically disconnecting the electrode from the output terminals when the insulator punctures and exposes the electrodes to the process environment causing a current to flow through the fuse.

30. The electrostatic chuck of claim 29, further comprising a first current detector for detecting flow of current through the peripheral fuses, and a second current detector for detecting flow of current through the central fuses,
   wherein when the insulator punctures and exposes an electrode to the process environment, a current discharges from the electrode and through the fuses, and
   wherein the first and second current detectors detect the current discharge before the fuse electrically disconnects the electrode from the output terminal of the power bus.

31. The electrostatic chuck of claim 29, further comprising first and second counters for counting the number of times a current discharges through the fuses.

32. An electrostatic chuck system for holding a substrate in a process environment, the system comprising:
   (a) an electrostatic chuck including:
      (i) a plurality of electrodes covered by insulator, the electrodes capable of electrostatically holding a substrate when a voltage is applied thereto;
      (ii) an electrical power bus having a plurality of output terminals, the output terminals capable of conducting voltage for operating the electrodes; and
      (iii) a plurality of fuses in the insulator, each fuse connecting at least one electrode to an output terminal from the power bus; and
   (b) a current detector for detecting flow of current through the fuses,
   wherein when the insulator punctures and exposes an electrode to the process environment, a current discharges from the electrode through the contiguous fuse, and
   wherein the current detector detects the current discharge before the fuse electrically disconnects the electrode from the output terminal of the power bus.

33. The system of claim 32, further comprising a counter for counting the number of times current discharges through the fuses.

34. A method of forming a failure resistant electrostatic chuck comprising electrodes connected via fuses to electrical power buses, the method comprising the steps of:
   (a) selecting a first insulator layer;
   (b) forming electrodes, electrical power buses, and fuses on the first insulator layer; and
   (c) forming a second insulator layer over the electrodes, electrical power buses, and fuses.

35. The method of claim 34, wherein in step (b) the fuses are formed by the steps of:
   (i) forming a resistor layer on the first insulator layer;
   (ii) forming a patterned resist layer on the resistor layer, the resist layer being patterned so that the resistor layer has exposed portions corresponding to the fuse configuration; and
   (iii) etching the exposed portions of the resistor layer to form fuses.

36. The method of claim 35, wherein in step (iii), the resistor layer is etched to form resistors capable of coupling at least one electrode to a power bus in a series arrangement.

37. The method of claim 34, wherein in step (b) the electrodes and electrical power buses are formed by the steps of:
   (i) forming a resistor layer on the first insulator layer;
   (ii) forming a patterned resist layer on a resistor layer, the resist layer being patterned so that the resistor layer has exposed portions corresponding to the electrodes and electrical power buses; and
   (iii) depositing electrically conductive material in the exposed portions of the patterned resist layer to form the electrodes and electrical power buses.

38. The method of claim 34, wherein in step (b) the electrodes and electrical power buses are formed by the steps of:
   (i) forming an electrical conductor layer on a layer comprising the fuses;
   (ii) forming a patterned resist layer on the electrical conductor layer, the resist layer being patterned so that the electrical conductor layer has exposed portions corresponding to the electrodes and electrical power buses; and
   (iii) etching the exposed portions of the electrical conductor layer to form the electrodes and electrical power buses.

39. A method of forming a failure resistant electrostatic chuck comprising electrodes connected to electrical power buses via resistors, the method comprising the steps of:
   (a) forming a composite layer including (i) a first insulator layer, (ii) a resistor layer, and (iii) an electrical conductor layer;
   (b) etching the composite layer to form (i) the electrodes and electrical power buses from the electrical conductor layer, and (ii) the resistors from the resistor layer, the resistors electrically connecting at least one electrode to an electrical power bus; and
   (c) forming a second insulator layer over the etched composite layer.

40. The method of claim 39, wherein step (b) comprises the steps of:
   (i) forming patterned resist layers on the electrical conductor and resistor layers, the resist layers being patterned so that the electrical conductor layer has first exposed portions corresponding to the electrodes and electrical power bus configurations, and the resistor layer has second exposed portions corresponding to the resistor configurations; and (ii) etching the first and second exposed portions of the electrical conductor and resistor layers to form the electrodes, electrical power buses, and resistors.

41. A method of forming a failure resistant electrostatic chuck comprising electrodes connected via resistors to an electrical power bus, the method comprising the steps of:

(a) forming a resistor layer and an electrical conductor layer on a first insulator layer;

(b) etching portions of the electrical conductor layer to form a plurality of electrodes and an electrical power bus;

(c) before or after step (b), etching portions of the resistor layer to form resistors, each resistor connecting at least one electrode to the electrical power bus; and (d) forming a second insulator layer over the etched electrical conductor and resistor layers.

42. The method of claim 41, wherein step (b) comprises the steps of:

(i) forming a patterned resist layer on the electrical conductor layer, the resist layer being patterned so that the electrical conductor layer has exposed portions corresponding to the electrode and electrical power bus configurations, and (ii) etching the exposed portions of the electrical conductor layer to form the electrode and electrical power bus.

43. The method of claim 41, wherein step (c) comprises the steps of:

(i) forming a patterned resist layer on the resistor layer, the resist layer being patterned so that the resistor layer has exposed portions corresponding to the resistor configurations; and (ii) etching the exposed portions of the resistor layer to form the resistors.

44. The method of claim 41, wherein in step (c), the resistor layer is etched so that the resistors couple the electrodes to the electrical power bus in a series arrangement.

45. A method of detecting failure of electrodes in an electrostatic chuck, the method comprising the steps of:

(a) electrostatically holding a substrate on the electrostatic chuck in an electrically charged process environment, the chuck comprising an insulator having: (1) a plurality of insulated electrodes for electrostatically holding a substrate when a voltage is applied thereto; (2) an electrical power bus having a plurality of output terminals for conducting voltage to the electrodes; and (3) a plurality of fuses, each fuse electrically connecting at least one electrode in series to an output terminal from the power bus; and (b) detecting a current discharge through a fuse that results after puncturing of the insulator on an electrode of the chuck.

46. The method of claim 45 further comprising the step of counting the current discharges through the fuses.

47. The method of claim 46 further comprising the step of replacing the electrostatic chuck when the number of current discharge counts exceeds a predetermined number.

48. A failure resistant electrostatic chuck for holding a substrate in a process environment, the chuck comprising an insulator including:

(a) a plurality of electrodes capable of electrostatically holding a substrate when a voltage is applied thereto;

(b) an electrical power bus having a plurality of output terminals for conducting voltage to the electrodes; and (c) at least one fuse that electrically connects at least one electrode in series to an output terminal from the power bus.

49. A failure resistant electrostatic chucking system for holding a substrate in a process environment, the chucking system comprising:

(a) an electrostatic chuck comprising:

(i) a plurality of electrodes in an insulator for electrostatically holding a substrate; and (ii) at least one electrical power bus having a plurality of output terminals for conducting voltages to the electrodes; and (iii) at least one fuse in the insulator for electrically connecting one or more electrodes in series to an output terminal from a power bus, the fuse capable of electrically disconnecting the electrodes from the output terminal when the insulator punctures and exposes the electrodes to the process environment causing a current to flow through the fuse; and (b) at least one counter for counting the number of times a current discharges through the fuses.

50. The electrostatic chuck of claim 49 wherein the electrodes comprise peripheral electrodes in a periphery portion of the insulator, and central electrodes in a central portion of the insulator.

51. The electrostatic chuck of claim 50 wherein the power bus comprises a first power bus having a first set of output terminals for providing voltage to the peripheral electrodes, and a second power bus having a second set of output terminals for providing voltage to the central electrodes.

52. The electrostatic chuck of claim 51 wherein the counter comprises first counters for counting the number of times current discharges through the peripheral electrodes, and second counters for counting the number of times current discharges through the central electrodes.

53. A method of determining the need for replacement of the electrostatic chuck, the method comprising the steps of:

(a) electrostatically holding a substrate on an electrostatic chuck comprising an insulator having embedded therein (i) a plurality of electrodes, and (ii) fuses connecting the electrodes to an external power supply;

(b) counting the number of current discharges through the fuses that occur during operation of the chuck; and (c) replacing the chuck when the number of current discharges exceeds a predetermined level.

54. An electrostatic chuck system for holding a substrate in a process environment, the system comprising:

(a) an electrostatic chuck including: (i) a plurality of electrodes covered by insulator, the electrodes capable of electrostatically holding a substrate when a voltage is applied thereto; (ii) an electrical power bus having a plurality of output terminals, the output terminals capable of conducting voltage for operating the electrodes; and (iii) at least one fuse in the insulator, the fuse connecting one or more electrodes to an output terminal from the power bus;

(b) a current detector for detecting a current discharge through the fuse that occurs when the insulator punctures and exposes an electrode to the process environment; and (c) a counter for counting the number of times a current discharges through the fuses.

55. A method of forming a failure resistant electrostatic chuck comprising the step of forming an insulator having therein (i) one or more electrodes for electrostatically holding a substrate to the insulator, and (ii) fuses that connect the electrodes to an external power supply.

56. The method of claim 55 wherein the fuses in the insulator are formed by the step of embedding fuses in the insulator.

57. The method of claim 55 wherein the fuses in the insulator are formed by the steps of:
   (i) forming a resistor layer on a first insulator layer;
   (ii) forming a patterned resist layer on the resistor layer, the resist layer being patterned to cover portions of the resistor layer that correspond to the fuse configuration with exposed portions therebetween;
   (iii) etching the exposed portions of the resistor layer to form fuses; and
   (iv) forming a second insulator layer over the fuses.

58. A failure resistant electrostatic chuck comprising an insulator having therein (i) one or more electrodes for electrostatically holding a substrate to the insulator, and (ii) fuses for connecting the electrodes to an external power supply.

59. The electrostatic chuck of claim 58 wherein the insulator further comprises an embedded electrical power bus having a plurality of output terminals for conducting voltage to the electrodes; and wherein each fuse electrically connects at least one electrode in series to an output terminal from a power bus.

60. The electrostatic chuck of claim 59 wherein the fuses electrically disconnect the electrodes from the output terminals, when the insulator punctures and exposes the electrodes to the process environment and causes a current to flow through the fuses.

61. The electrostatic chuck of claim 59 wherein each fuse comprises at least one of the following characteristics:
   (a) the fuse is self-operating and capable of electrically disconnecting at least one electrode from an output terminal of the power bus;
   (b) the fuse electrically disconnects an electrode from an output terminal of the power bus when a current of at least about 500 microamps flows through the fuse; or
   (c) the fuse burns out in less than about 10 milliseconds in a current discharge.

62. The electrostatic chuck of claim 58 wherein each fuse comprises at least one of the following:
   (a) a resistor having a resistance of at least about 100 $\sigma$;
   (b) a material comprising carbon, nickel, phosphorous, chromium, tin, or mixtures thereof;
   (c) a material comprising nickel-phosphorous, nickel-chromium, chromium, or tin; and
   (d) a resistor having at least one of the following dimensions: (i) a thickness of from about 50 $\sigma$ to about 10,000 $\sigma$; (ii) a length from about 0.1 to 5 mm; or (iii) a width of from about 0.1 to 1 mm.

63. The electrostatic chuck of claim 58 wherein the electrodes comprise first and second groups of electrodes that are sized and configured to operate as bipolar electrodes.

64. The electrostatic chuck of claim 63 further comprising (i) a first electrical power bus having a first set of output terminals for providing voltage to the first group of electrodes, and (ii) a second electrical power bus having a second set of output terminals for providing voltage to the second group of electrodes.

65. A method of detecting failure of electrodes in an electrostatic chuck, the method comprising the steps of:
   (a) electrostatically holding a substrate on the chuck of claim 59 in an electrically charged process environment; and
   (b) detecting a current discharge through a fuse that results after puncturing of the insulator on an electrode of the chuck.

* * * * *